US012772426B2

(12) United States Patent
Kim

(10) Patent No.: US 12,772,426 B2
(45) Date of Patent: Oct. 20, 2026

(54) DISPLAY APPARATUS AND METHOD OF MANUFACTURING THE SAME

(71) Applicant: LG Display Co., Ltd., Seoul (KR)

(72) Inventor: Juhan Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 114 days.

(21) Appl. No.: 18/905,499

(22) Filed: Oct. 3, 2024

(65) Prior Publication Data

US 2025/0203830 A1 Jun. 19, 2025

(30) Foreign Application Priority Data

Dec. 15, 2023 (KR) ........................ 10-2023-0183159

(51) Int. Cl.
*H05K 9/00* (2006.01)

(52) U.S. Cl.
CPC .................................. *H05K 9/0054* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,593,061 | B2 * | 11/2013 | Yamada | H10K 59/87 313/503 |
| 8,625,043 | B2 * | 1/2014 | Hwang | G02F 1/133308 349/56 |
| 9,395,568 | B2 | 7/2016 | Jeong et al. | |
| 9,715,135 | B2 | 7/2017 | Jeong et al. | |
| 10,516,204 | B2 * | 12/2019 | Cho | H05K 5/03 |
| 10,613,364 | B2 * | 4/2020 | Fujii | H05B 33/22 |
| 12,568,592 | B2 * | 3/2026 | Kim | H04M 1/0266 |
| 2005/0030466 | A1 * | 2/2005 | Kanatsu | G02F 1/13452 349/149 |
| 2011/0050657 | A1 * | 3/2011 | Yamada | H10K 59/87 361/679.01 |
| 2014/0139984 | A1 * | 5/2014 | Jung | G06F 1/1601 361/679.01 |
| 2016/0234949 | A1 * | 8/2016 | Seo | H05K 5/03 |
| 2018/0164923 | A1 * | 6/2018 | Hirabayashi | G09F 9/30 |
| 2019/0204660 | A1 * | 7/2019 | Maemuko | G02F 1/133308 |
| 2020/0092408 | A1 * | 3/2020 | Moon | H04M 1/0266 |
| 2020/0381661 | A1 * | 12/2020 | Lee | H05K 1/0281 |
| 2025/0203830 | A1 * | 6/2025 | Kim | H04M 1/0266 |

FOREIGN PATENT DOCUMENTS

| | | | |
|---|---|---|---|
| KR | 10-2014-0085993 | A | 7/2014 |
| KR | 10-1541352 | B1 | 8/2015 |

* cited by examiner

*Primary Examiner* — Lisa Lea-Edmonds
(74) *Attorney, Agent, or Firm* — Seed Intellectual Property Law Group LLP

(57) ABSTRACT

A display apparatus according to one embodiment may include a display module for displaying an image, a metal plate disposed behind the display module, a cover member disposed in front of the display module, and an adhesive member disposed between the display module and the metal plate, in which the adhesive member may include a protective part attached to side surfaces of the display module and having one end attached to the cover member.

16 Claims, 8 Drawing Sheets

DISPLAY APPARATUS AND METHOD OF MANUFACTURING THE SAME

CROSS REFERENCE TO RELATED APPLICATION

The present application claims priority to Korean Patent Application No. 10-2023-0183159, filed Dec. 15, 2023, the entire contents of which is incorporated herein for all purposes by this reference.

BACKGROUND

Technical Field

The present disclosure relates to a display apparatus and a method of manufacturing the same, and more specifically, to a display apparatus having a structure capable of suppressing the permeation of moisture into both side surfaces of a display module, and a method of manufacturing the same.

Description of the Related Art

Contents described in this section simply provide background information on the present disclosure and do not constitute the related art.

In the full-fledged information age, the field of display apparatuses for visually displaying electrical information signals is developing rapidly, and research for developing performance, such as thinness, lightweight, and lower power consumption, for various display apparatuses is being continuously conducted.

Such display apparatuses include a liquid crystal display (LCD) device, a quantum dot display panel device (QD), a field emission display (FED) device, and an electro-wetting display (EWD) device, an organic light emitting diode (OLED) display apparatus, etc.

The display apparatuses have been developed to be miniaturized so that users may carry the display apparatuses or to be mounted on movable devices such as vehicles, etc., and are being improved so that the users may use the display apparatuses more conveniently.

BRIEF SUMMARY

A display module may be built into a case that forms the appearance of a display panel. A cover member may be coupled to the case and disposed to be exposed to a front portion of a display apparatus. Therefore, the display module may be surrounded by a case and a cover member and disposed inside the display apparatus.

The case and the cover member do not fully seal the inside of the display apparatus, and thus a gap may occur at a portion in which the case and the cover member are coupled.

Moisture may permeate into the display apparatus through such a gap, and when moisture permeates the display module, the display panel may be damaged, or the image quality of a display screen may be degraded.

Moisture may permeate through the above-described gap at both ends of side surfaces of the display module. Therefore, there is a need for a structure that can suppress moisture from permeating both ends of the side surfaces of the display module.

In addition, a light leakage phenomenon in which light of the display panel leaks may occur at both ends of the side surfaces of the display module. Due to such a light leakage phenomenon, the resolution of the display screen can be degraded, and in particular, an image or video may be distorted in an area in which the light leakage phenomenon occurs.

Therefore, there is a need for a structure capable of suppressing light leakage at both ends of the side surfaces of the display module.

The present disclosure is directed to providing a display apparatus having a structure capable of preventing moisture from permeating both ends of side surfaces of a display module.

In addition, the present disclosure is directed to providing a display apparatus having a structure capable of suppressing light leakage from both ends of side surfaces of a display module.

In addition, the present disclosure is directed to providing a display apparatus having a structure capable of suppressing moisture permeation and light leakage at both ends of side surfaces of a display module.

Objects of the present disclosure are not limited to the above-described objects, and other objects and advantages of the present disclosure which are not mentioned can be understood by the following description and more clearly understood by embodiments of the present disclosure. In addition, it will be able to be easily seen that the objects and advantages of the present disclosure may be achieved by devices and combinations thereof that are described herein.

One embodiment of a display apparatus may include a cover member disposed in front of a display module, and an adhesive member disposed between the display module and the metal plate, wherein the adhesive member may include a protective part attached to side surfaces of the display module and having one end attached to the cover member.

The adhesive member may be made of an opaque material, and the protective part may be bent from the side surfaces of the display module and attached to the side surfaces of the display.

The display apparatus may further include an adhesive layer disposed between the cover member and the display module.

The adhesive member and the metal plate may be manufactured as one package and coupled to the display module.

The package may include a cutting part which has the adhesive member attached to the metal plate and is a cut portion formed on an end portion of the metal plate.

One embodiment of a method of manufacturing a display apparatus may include coupling a package to a display module, removing an adhesive film that couples a cutting part of a metal plate to an adhesive member, bending a protective part of the adhesive member, and attaching the protective part to side surfaces of the display module.

The cutting part may be disposed at a location of the adhesive member at which the protective part is formed, and a width of the cutting part may be formed to be greater than a width of the protective part.

The adhesive member may include an exposed area exposed at a portion that meets an edge of the metal plate in a front-rear direction.

Another embodiment of a display apparatus may include a printed circuit board disposed behind the metal plate, a chip on film (COF) having one side electrically connected to the display module and the other side electrically connected to the printed circuit board, a cover member disposed in front of the display module, and an adhesive member disposed between the display module and the metal plate.

The adhesive member includes a protective part attached to side surfaces of the display module and having one end attached to the cover member.

The protective part may be bent from the side surfaces of the display module and attached to the side surfaces of the display module, and the adhesive member may be made of an opaque material.

DETAILED DESCRIPTION

Figure 1:
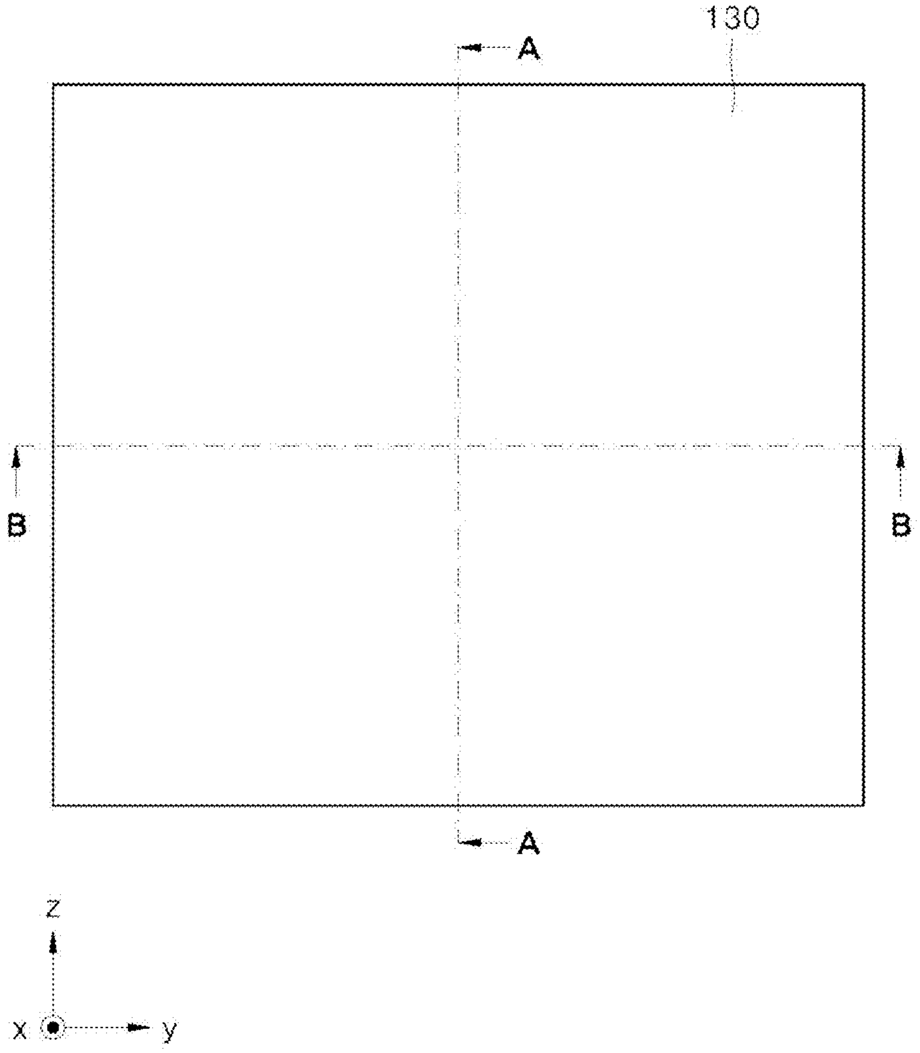
FIG. 1 is a front view showing a display apparatus according to one embodiment.

The above-described objects, features, and advantages will be described below in detail with reference to the accompanying drawings, and thus those skilled in the art to which the present disclosure pertains will be able to easily carry out the technical spirit of the present disclosure. In describing the present disclosure, when it is determined that a detailed description of the known technology related to the present disclosure may unnecessarily obscure the gist of the present disclosure, a detailed description thereof will be omitted. Hereinafter, exemplary embodiments according to the present disclosure will be described in detail with reference to the accompanying drawings. In the drawings, the same reference numerals are used to denote the same or similar components.

Although terms such as first and second are used to describe various components, it goes without saying that the components are not limited by these terms. These terms are only used to distinguish one component from another component, and unless otherwise stated, it goes without saying that the first component may be the second component.

Throughout the specification, unless otherwise stated, each component may be singular or plural.

The singular expression used herein includes the plural expression unless the context clearly dictates otherwise. In the application, terms such as "composed of" or "comprising" should not be construed as necessarily including all of the various components or operations described in the specification and should be construed as not including some of the components or some of the operations or further including additional components or operations.

Throughout the specification, when "A and/or B" is described, this means A, B, or A and B unless otherwise specified, and when "C to D" is described, this means C or more and D or less unless otherwise specified.

In the following description, when the user views the display apparatus in a state in which the display apparatus is disposed to be generally used, a direction in which the user is located is referred to as "forward," and a direction opposite to the front is referred to as "backward."

In addition, "vertically," "upper side," "lower side," "above," "under" indicates a location or direction of each component in a state in which the display apparatus is disposed to be generally used. In the drawing, "forward" indicates a +X-axis direction, "backward" indicates a −X-axis direction, and "vertically" indicates a Z-axis direction.

A display apparatus according to the embodiment may be mounted, for example, on a dashboard of a vehicle to provide a video or image required for driving to a driver and a passenger of the vehicle. However, the present disclosure is not limited thereto, and the display apparatus may be used while carried by the user rather than mounted on the vehicle. Hereinafter, for example, a display apparatus mounted on a vehicle will be described.

Figure 2:
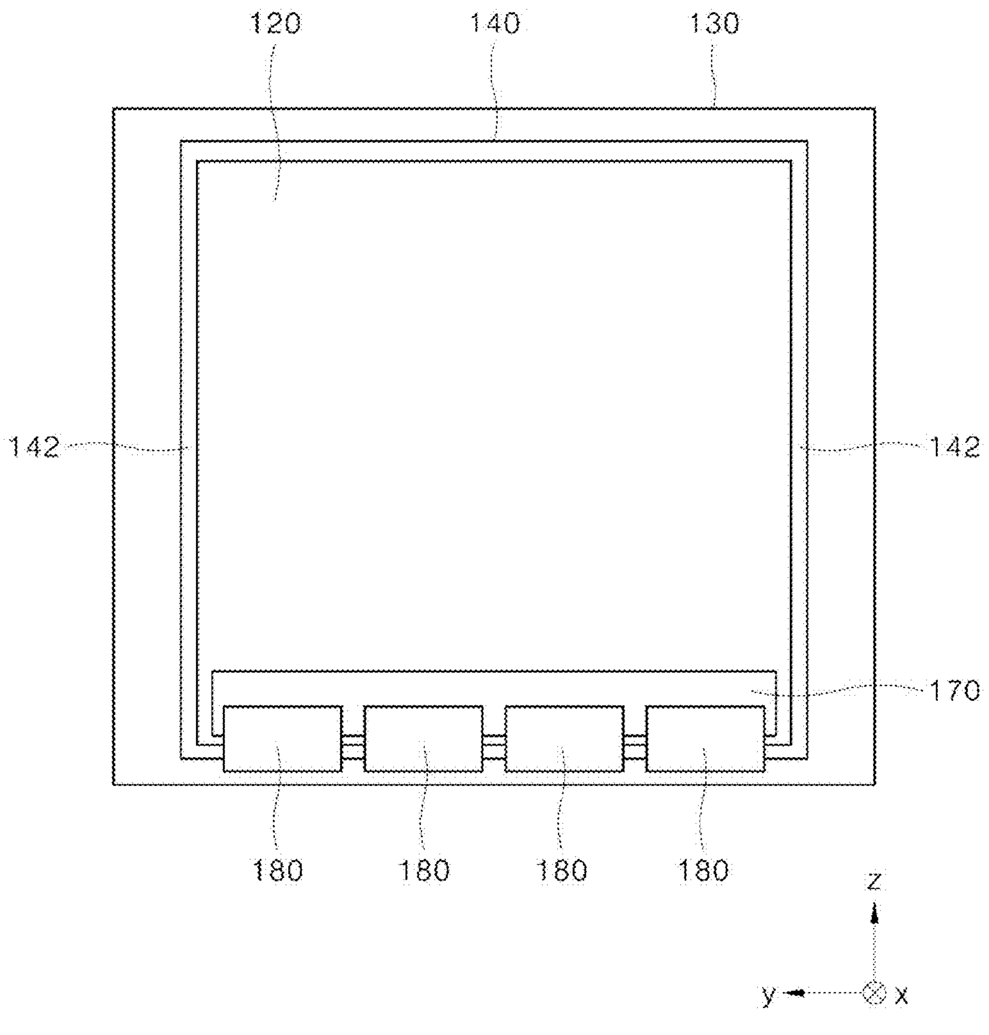
FIG. 2 is a rear view of the display apparatus according to one embodiment.
Figure 3:
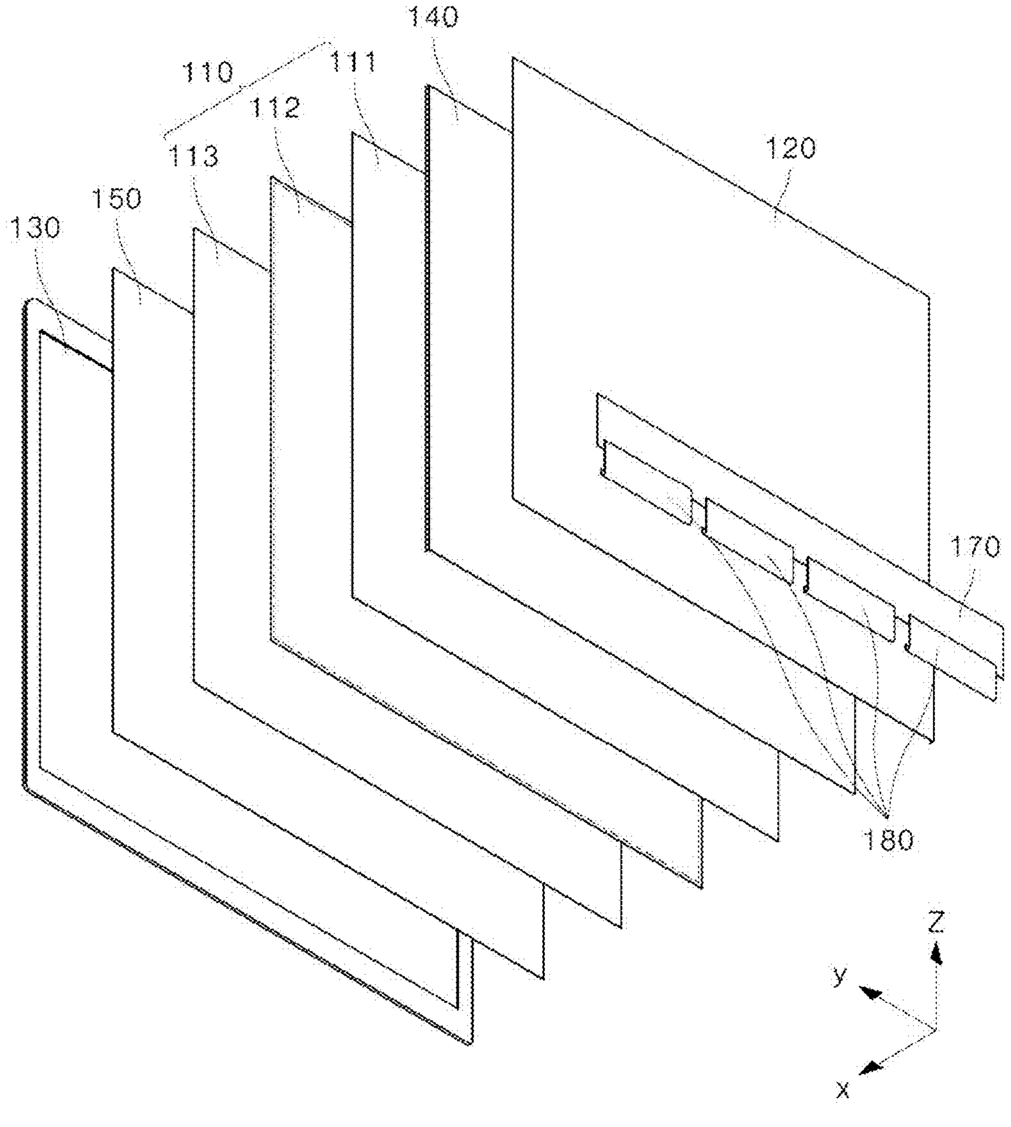
FIG. 3 is an exploded view of the display apparatus according to one embodiment.

FIG. 1 is a front view showing a display apparatus according to one embodiment. FIG. 2 is a rear view of the display apparatus according to one embodiment. FIG. 3 is an exploded view of the display apparatus according to one embodiment.

The display apparatus according to one embodiment may include a display module 110, a metal plate 130, and an adhesive member 140.

The display module 110 may be provided to display a video or image. The video or image to be displayed may be navigation information necessary for traveling, video captured by a camera mounted on the vehicle, or various other contents needed by a driver or passengers.

The metal plate 120 may be disposed behind the display module 110. The metal plate 120 may serve as a heat sink for cooling the display panel 112 by dissipating heat generated from the display panel 112 provided in the display module 110 to the outside.

The metal plate 120 may be made of, for example, aluminum, copper, or a metal material containing the same, which has a high heat transfer rate. However, the present disclose is not limited thereto.

The cover member 130 may be disposed in front of the display module 110. The cover member 130 may be disposed at the forefront of the display apparatus. The cover member 130 may be disposed in front of the display panel 112 to protect the display panel 112. The cover member 130 may be made of a transparent material to allow light emitted from the display panel 112 to pass through the cover member 130.

The adhesive member 140 may be disposed between the display module 110 and the metal plate 120. The adhesive member 140 may bond the display module 110 and the metal plate 120. Therefore, the adhesive member 140 may be made of or include a material having a good adhesive strength, such as a pressure sensitive adhesive (PSA).

The display apparatus may include an adhesive layer 150, a printed circuit board 170, and a chip on film (COF) 180.

The adhesive layer 150 may be disposed between the cover member 130 and the display module 110 to attach the cover member 130 to the display panel 112. The adhesive layer 150 may be formed of a transparent material because light emitted from the display panel 112 must pass therethrough.

Therefore, the adhesive layer 150 may be made of or include a material that is transparent and has good adhesion, such as an optical clear adhesive (OCA), an optical clear resin (OCR), or the PSA.

The printed circuit board 170 may be disposed behind the metal plate 120. The printed circuit board 170 may be disposed behind the metal plate 120 and electrically connected to the display panel 112 of the display module 110.

The printed circuit board 170 may be provided with a device for communicating with external devices such as a camera module or a main control module of a vehicle, a device for driving the display panel 112 so that the display panel 112 displays a video or image, etc., a circuit, and various other active and passive elements.

The chip on film 180 may have one side electrically connected to the display panel 112 of the display module 110 and the other side electrically connected to the printed circuit board 170. The chip on film 180 may be attached to one surface of the display panel 112 of the display module 110 and electrically connected to the display module 110.

The chip on film 180 may be disposed so that a portion is bent to surround an end portion of the metal plate 120. The chip on film 180 may be formed thinly and made of a flexible material to enable bending.

The chip on film 180 may electrically connect the display panel 112 with the printed circuit board 170. The chip on film 180 may be provided with various active and passive elements and provided with a driving circuit for driving the display panel 112.

The driving circuit for driving the display panel 112 may be provided to be dispersed on each of the printed circuit board 170 and the chip on film 180. The chip on film 180 may be provided with a driving element that forms at least a portion of the driving circuit of the display panel 112. A plurality of chip on films 180 may be provided. The chip on films 180 may be disposed to be spaced apart from each other.

The display module 110 according to one embodiment may include a back plate 111, the display panel 112, and a polarizer 113.

The back plate 111 may be disposed in front of the adhesive member 140. The back plate 111 may be disposed between the display panel 112 and the metal plate 120.

The back plate 111 may be attached to the rear surface of the display panel 112, thereby suppressing the display panel 112 from being damaged by being bent. That is, the back plate 111 may serve to reinforce the rigidity of the display panel 112.

The back plate 111 may be provided, for example, in the form of a film and attached to the display panel 112. However, the present disclosure is not limited thereto.

The display panel 112 may be disposed in front of the back plate 111 to display a video or image. The video or image to be displayed may be navigation information necessary for traveling, video captured by a camera mounted on the vehicle, or various other contents needed by a driver or passengers.

The display panel 112 may be electrically connected to the chip on film 180 and electrically connected to the printed circuit board 170 through the chip on film 180. Therefore, the controller and driving elements provided on the chip on film 180 and/or the printed circuit board 170 may control the operation of the display panel 112.

The polarizer 113 may be disposed between the display panel 112 and the light control layer 150. The polarizer 113 may be disposed in front of the display panel 112. The polarizer 113 can increase outdoor visibility and contrast ratio for images displayed on the display panel 112 by preventing reflection of external light.

The display module 110 may be built into a case 190 that forms the appearance of the display panel 112. The cover member 130 may be coupled to the case 190 and disposed to be exposed to the front portion of the display apparatus. Therefore, the display module 110 may be surrounded by the case 190 and the cover member 130 and disposed inside the display apparatus.

The case 190 and the cover member 130 do not fully seal the inside of the display apparatus, and thus a gap may occur in a portion in which the case 190 and the cover member 130 are coupled.

Moisture may permeate the display apparatus through such a gap, and when moisture permeates the display module 110, the display panel 112 may be damaged, or the image quality of a display screen may be degraded.

Moisture can easily permeate both ends of side surfaces of the display module 110 through the above-described gap. Therefore, there is a need for a structure capable of suppressing moisture from permeating both ends of the side surfaces of the display module 110.

In addition, a light leak phenomenon in which light of the display panel 112 leaks may occur at both ends of the side surfaces of the display module 110. Due to such a light leakage phenomenon, the resolution of the display screen can be degraded, and in particular, an image or video may be distorted in an area in which the light leakage phenomenon occurs.

Therefore, there is a need for a structure capable of suppressing the occurrence of light leakage at both ends of the side surfaces of the display module 110.

Hereinafter, the structure capable of suppressing the above-described moisture permeation and light leakage at both ends of the side surfaces of the display module 110 will be described in detail.

Figure 4:
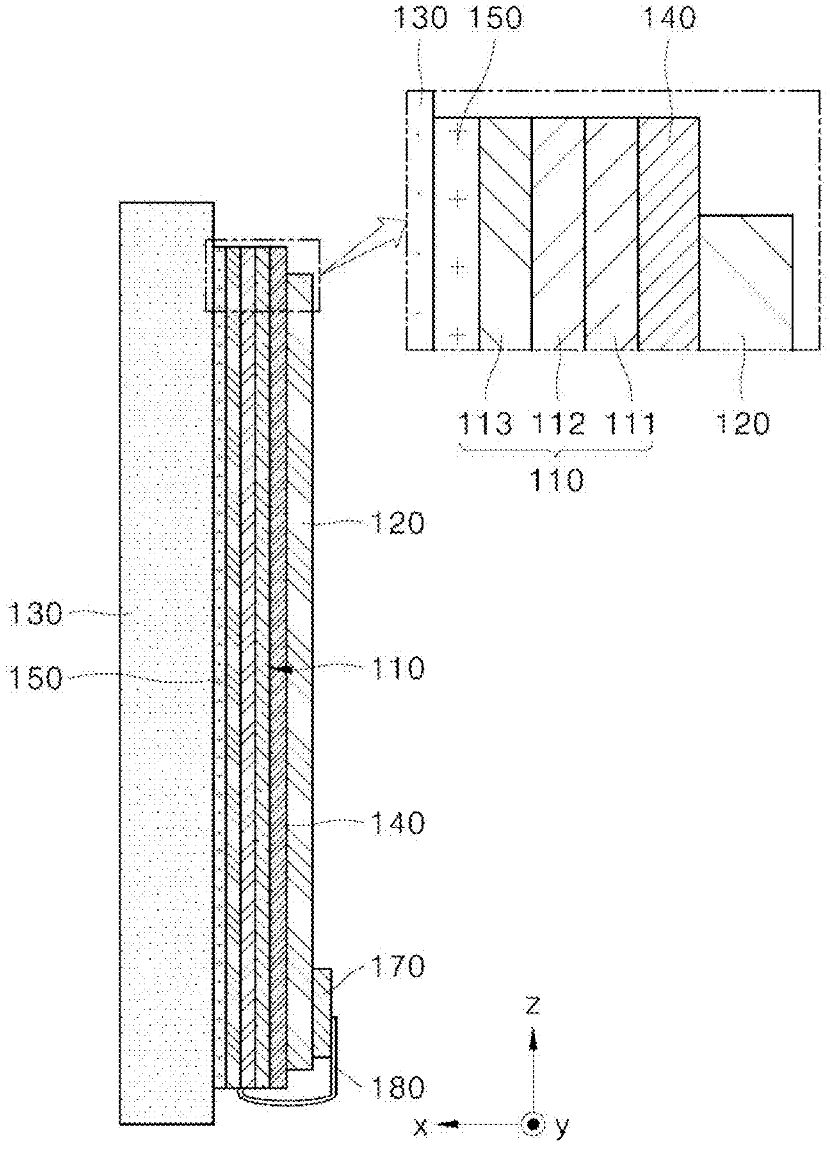
FIG. 4 is a side cross-sectional view of portion AA in FIG. 1.
Figure 5:
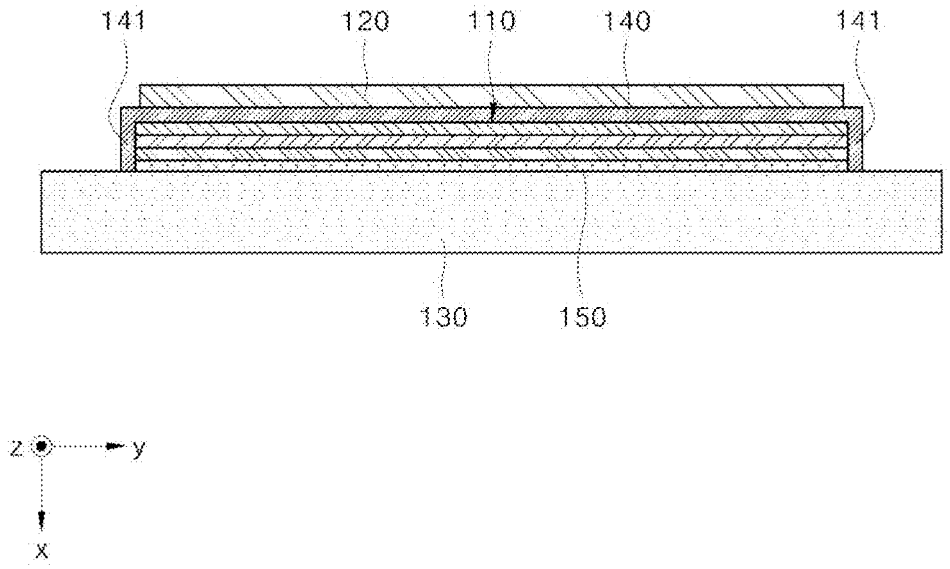
FIG. 5 is a plan cross-sectional view of portion BB in FIG. 1.

FIG. 4 is a side cross-sectional view of portion AA in FIG. 1. FIG. 5 is a plan cross-sectional view of portion BB in FIG. 1.

In an embodiment, the adhesive member 140 may be attached to the side surfaces of the display module 110 and may include a protective part 141 having one end attached to the cover member 130. The protective part 141 may be formed integrally with the adhesive member 140.

The protective part 141 may be provided to further extend from both ends of the display module 110 to cover both ends of the display module 110. That is, the protective part 141 may be a portion of the adhesive member 140 that further extends outward from both ends of the display module 110 to cover the side surfaces of the display module 110.

The protective part 141 may be bent from the side surfaces of the display module 110 and attached to the side surfaces of the display module 110. The protective part 141 extending from the adhesive member 140 may be bent and attached to the side surfaces of the display module 110.

In this case, when the adhesive member 140 is in a cured state, the bent portion of the protective part 141 and/or the adhesive member 140 may be heated to be flexible for bending, and then bent and attached to the side surfaces of the display module 110.

The adhesive member 140 may be made of an opaque material. Since the protective part 141 is a portion of the adhesive member 140, the adhesive member 140 may be made of an opaque material so that the protective part 141 prevents light leakage of the display module 110.

For example, the adhesive member 140 may be made of a black PSA, which is black and does not allow light to pass therethrough. However, the present disclosure is not limited thereto, and the adhesive member 140 may be selected from a wide range of materials that are opaque and have good adhesive properties.

The protective part 141 may be attached to side surfaces of the adhesive layer 150. The protective part 141 of the adhesive member 140 may be made of an adhesive material, and the adhesive layer 150 may also be made of an adhesive material.

Therefore, the protective part 141 may be attached to the side surfaces of the adhesive layer 150 so that the protective part 141 and the adhesive layer 150 that are made of a material having good adhesiveness may bonded. Therefore, the protective part 141 may be firmly coupled to the adhesive layer 150, thereby significantly increasing durability.

Figure 6:
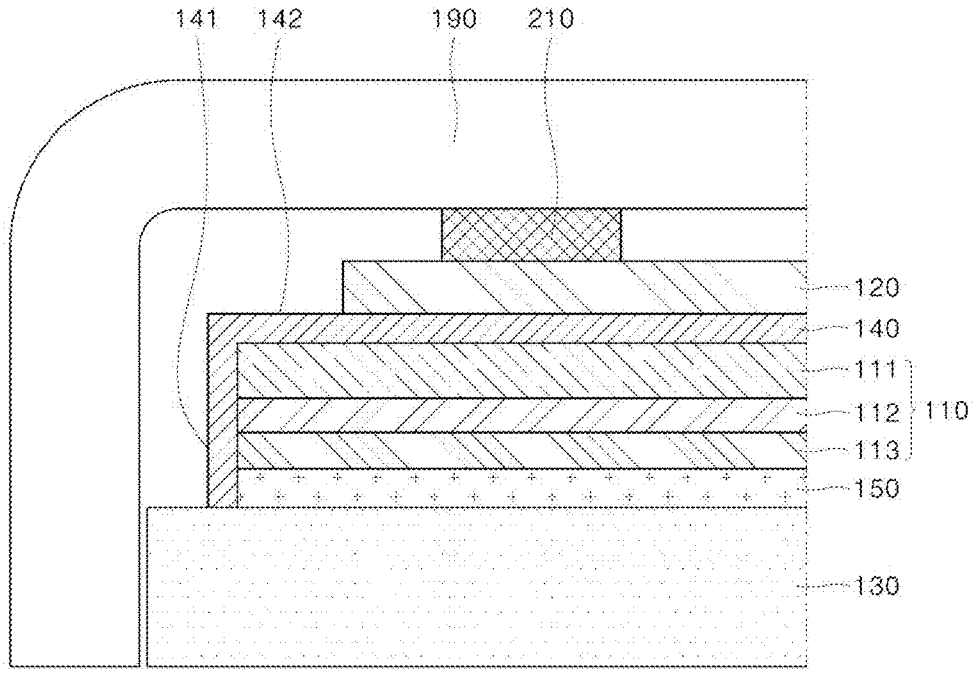
FIG. 6 is a cross-sectional view showing a portion of the display apparatus according to one embodiment.

FIG. 6 is a cross-sectional view showing a portion of the display apparatus according to one embodiment. The display module 110 may be accommodated in the case 190. The front of the case 190 may be closed by the cover member 130.

In this case, the metal plate 120 and the case 190 may be attached by an adhesive tape 210. Therefore, components of the display apparatus may be accommodated in the case 190. Even when the assembly of the display apparatus is finished as described above, a gap may occur between the cover member 130 and the case 190.

Even when moisture permeates from the outside through such a gap, the protective part 141 fully seals the side surfaces of the display module 110, and thus the display module 110 can be protected from moisture permeating the case 190.

In an embodiment, since the protective unit 141 fully seals the side surfaces of the display module 110, the display panel 112 provided in the display module 110 is not in contact with moisture, and thus it is possible to effectively suppress damage to the display panel 112.

In addition, since the protective part 141 is made of an opaque material to fully seal the side surfaces of the display module 110, it is possible to effectively suppress light leakage in which light leaks to the outside from the side surfaces of the display panel 112 of the display module 110.

Therefore, it is possible to increase the resolution of the display panel 112 and effectively suppress the distortion of the image or video displayed on the display apparatus due to light leakage.

In an embodiment, it is necessary to easily manufacture the display apparatus having a structure in which the protective part 141 is attached to the side surfaces of the display module 110. The above may be implemented by manufacturing a package 20 having the protective part 141 and manufacturing the display apparatus using the package 20. This will be described in detail below.

Figure 7:
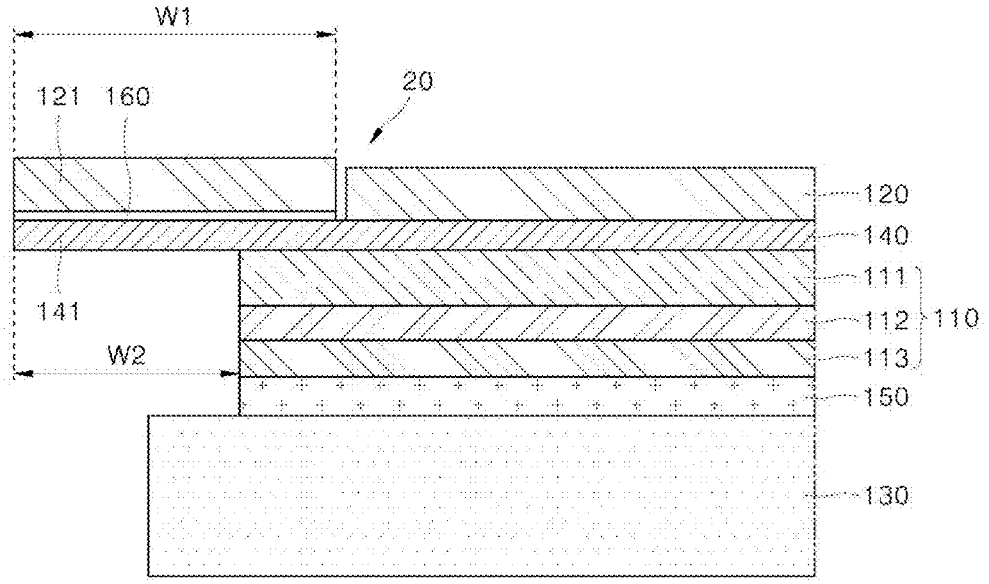
FIG. 7 is a view for describing a manufacturing process of the display apparatus according to one embodiment.
Figure 8:
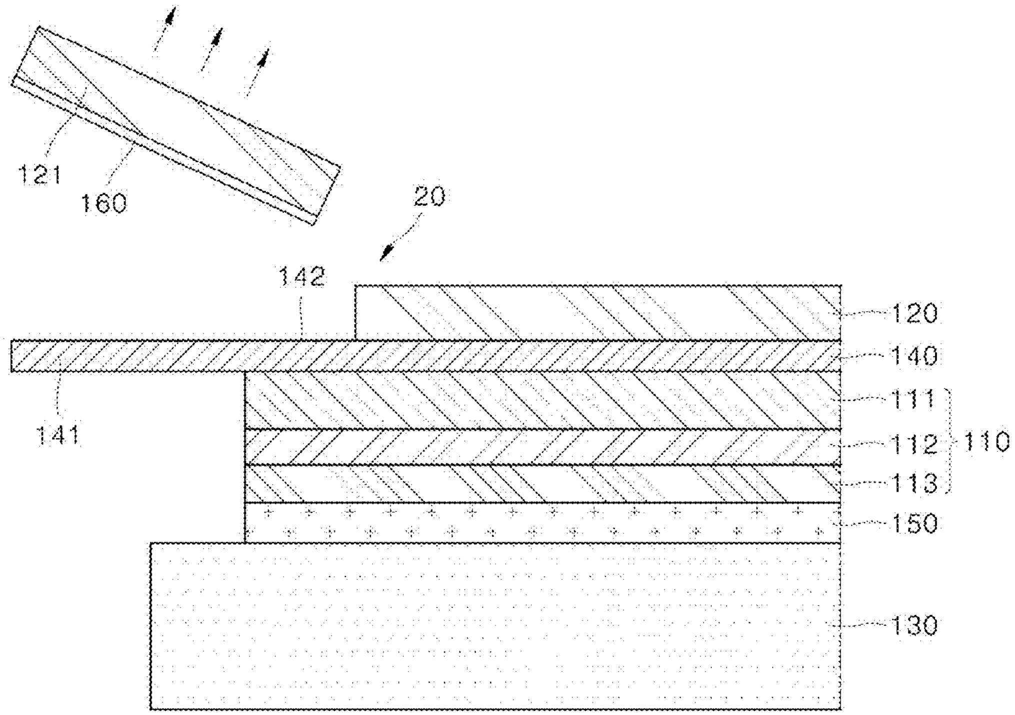
FIG. 8 is a view showing a state in which a portion of a package is removed from FIG. 7.
Figure 9:
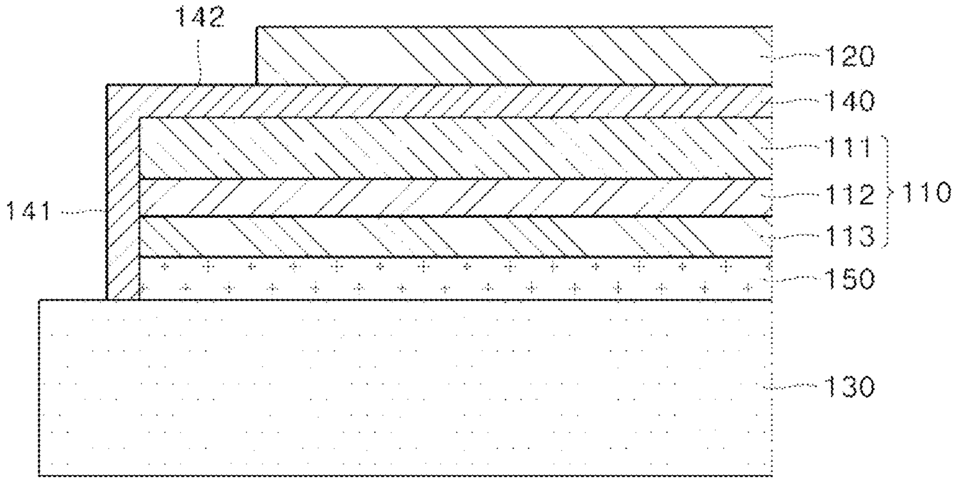
FIG. 9 is a view showing a state in which a protective part of an adhesive member is bent and attached in the display apparatus.

FIG. 7 is a view for describing a manufacturing process of the display apparatus according to one embodiment. FIG. 8 is a view showing a state in which a portion of the package 20 is removed from FIG. 7. FIG. 9 is a view showing a state in which the protective part 141 of the adhesive member 140 is bent and attached in the display apparatus.

In an embodiment, a display apparatus may be manufactured by performing a process in the order of FIGS. 7 to 9.

In an embodiment, the adhesive member 140 and the metal plate 120 may be manufactured as the same package 20 and coupled to the display module 110. The package 20 is manufactured separately, and the display apparatus may be manufactured by attaching the package 20 to the display module 110.

When the adhesive member 140 is attached to the display module 110, both sides of the adhesive member 140 are bent to attach the protective part 141 to the side surfaces of the display module 110, and then the metal plate 120 is attached to the adhesive member 140, it may be difficult to arrange the metal plate 120 at a designed location of the adhesive member 140.

In particular, difficulties may occur when such a process is performed manually by an operator rather than by an automated device.

Therefore, in an embodiment, it is possible to significantly reduce the defect rate of the display apparatus in a method of first manufacturing the package 20 using an automated device and attaching the package 20 to the display module 110.

The package 20 may have a structure in which the adhesive member 140 and the metal plate 120 are coupled. In this case, the package 20 may include a cutting part 121 and an adhesive film 160.

That is, the package 20 may include a cutting part 121 which has the adhesive member 140 attached to the metal plate 120 and is a cut portion formed on an end portion of the metal plate 120. In addition, the package 20 may include the adhesive film 160 that attaches the cutting part 121 to the adhesive member 140.

Referring to FIG. 7, the cutting part 121 is formed on the end portion of the metal plate 120 and cut from the metal plate 120. Of course, the cutting part 121 may be made of the same material as the metal plate 120.

For example, one metal plate 120 may be manufactured, and a side edge of the metal plate 120 may be partially cut to form the cutting part 121. Thereafter, the metal plate 120 may be fixedly bonded to the adhesive member 140. Meanwhile, the cutting part 121 may be bonded to the adhesive member 140 by the adhesive film 160.

The cutting part 121 may be provided to be easily removed from the adhesive member 140. To this end, the adhesive film 160 may be made of a material having a weaker adhesive strength than the adhesive member 140 to be easily attached or removed.

The cutting part 121 may be disposed at a location of the adhesive member 140 at which the protective part 141 is formed. Therefore, when the cutting part 121 and the adhesive film 160 are removed, the side edge of the adhesive member 140 may be exposed, and a portion of the exposed portion may be bent to form the protective part 141.

Meanwhile, a width W1 of the cutting part 121 may be formed to be greater than a width W2 of the protective part 141. Since the adhesive member 140 may be formed to have a greater area than the metal plate 120 in a front-rear direction of the display apparatus, to form such a structure, the width W1 of the cutting part 121 may be formed to be greater than the width W2 of the protective part 141.

The adhesive member 140 may include an exposed area 142 exposed at a portion that meets the edge of the metal plate 120 in the front-rear direction. A portion of the exposed area 142 may be later bent to become the protective part 141.

The exposed area 142 entirely surrounds the side surfaces and edges of the display module 110, and thus may become a portion that suppresses moisture permeation into and light leakage from the side surfaces of the display module 110.

Referring to FIG. 8, after the package 20 is attached to the display module 110, the cutting part 121 and the adhesive film 160 may be removed. Therefore, the exposed area 142 of the adhesive member 140 may be formed, and a portion of the exposed area 142 may be bent to form the protective part 141.

Referring to FIG. 9, the protective part 141 of the adhesive member 140 may be bent and attached to the side surfaces of the display module 110. When the adhesive member 140 is in a cured state, the bent portion of the protective part 141 and/or the adhesive member 140 may be heated to be flexible for bending, and then bent and attached to the side surfaces of the display module 110.

In this case, as described above, the protective part 141 may be attached to the side surfaces of the adhesive layer 150 so that the protective part 141 and the adhesive layer 150 that are made of a material having good adhesiveness may bonded. Therefore, the protective part 141 may be firmly coupled to the adhesive layer 150, thereby significantly increasing durability.

Figure 10:
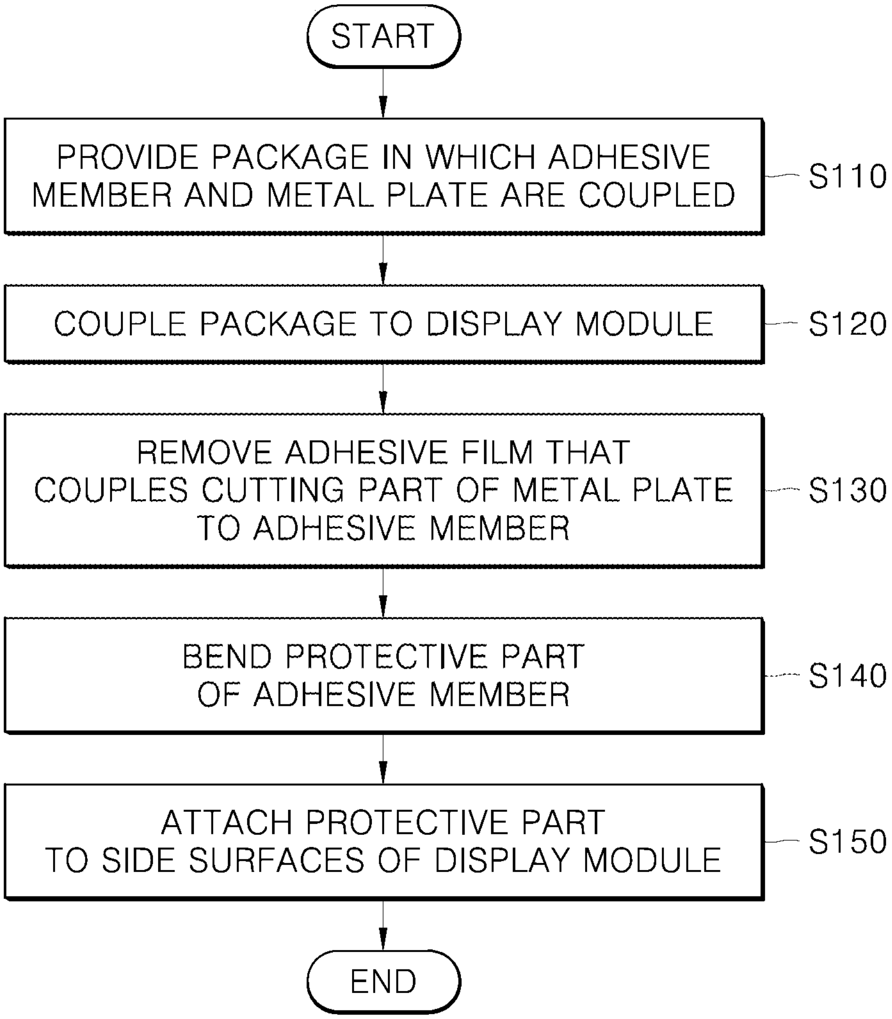
FIG. 10 is a flowchart for describing a method of manufacturing the display apparatus according to one embodiment.

FIG. 10 is a flowchart for describing a method of manufacturing the display apparatus according to one embodiment.

First, the package 20 in which the adhesive member 140 and the metal plate 120 are coupled may be provided (S110). The package 20 may be manufactured using an automated device, thereby shortening the manufacturing time of the display apparatus and increasing a production volume.

Then, the package 20 may be coupled to the display module 110 (S120). The separately manufactured package 20 may be coupled to the display module 110, and the adhesive member 140 of the package 20 may be attached to the back plate 111 of the display module 110 without providing other coupling means to couple the package 20 to the display module 110.

Then, the adhesive film 160 that couples the cutting part 121 of the metal plate 120 to the adhesive member 140 may be removed (S130). As described above, the cutting part 121 may be disposed at a location of the adhesive member 140 at which the protective part 141 is formed, and the width W1 of the cutting part 121 may be formed to be greater than the width W2 of the protective part 141.

In addition, as described above, the adhesive member 140 may include the exposed area 142 exposed at a portion that meets the edge of the metal plate 120 in the front-rear direction. When the adhesive film 160 is removed, the exposed area 142 may be exposed to the outside.

Then, the protective part 141 of the adhesive member 140 may be bent (S140). The bending operation of the adhesive member 140 may be performed using an automated device or manually by an operator.

Then, the protective part 141 may be attached to the side surfaces of the display module 110 (S150). In this case, an end portion of the protective part 141 may be attached to the side surfaces of the adhesive layer 150 so that the protective part 141 may firmly seal the side surfaces of the display module 110.

A display apparatus according to one embodiment may include a display module for displaying an image, a metal plate disposed behind the display module, a cover member disposed in front of the display module, and an adhesive member disposed between the display module and the metal plate, in which the adhesive member may include a protective part attached to side surfaces of the display module and having one end attached to the cover member.

The protective part may be bent from the side surfaces of the display module and attached to the side surfaces of the display module.

The adhesive member may be made of an opaque material.

The display apparatus may further include an adhesive layer disposed between the cover member and the display module, and the protective part may be attached to side surfaces of the adhesive layer.

The display module may include a back plate disposed in front of the adhesive member, and a display panel disposed in front of the back plate and for displaying an image.

The display module may include a polarizer disposed between the display panel and the adhesive layer.

The adhesive member and the metal plate may be manufactured as one package and coupled to the display module.

The package may include a cutting part which has the adhesive member attached to the metal plate and is a cut portion formed on an end portion of the metal plate.

The package may include an adhesive film that attaches the cutting part to the adhesive member.

The cutting part may be disposed at a location of the adhesive member at which the protective part is formed.

After the package is attached to the display module, the cutting part and the adhesive film may be removed, and the protective part of the adhesive member may be bent and attached to the side surfaces of the display module.

A method of manufacturing a display apparatus according to one embodiment may include providing a package in which the adhesive member and the metal plate are coupled, coupling the package to the display module, removing the adhesive film that couples the cutting part of the metal plate to the adhesive member, bending the protective part of the adhesive member, and attaching the protective part to side surfaces of the display module.

The cutting part may be disposed at a location of the adhesive member at which the protective part is formed, and a width of the cutting part may be formed to be greater than a width of the protective part.

The adhesive member may include an exposed area exposed at a portion that meets an edge of the metal plate in a front-rear direction.

A display apparatus according to another embodiment may include a display module for displaying an image, a metal plate disposed behind the display module, a printed circuit board disposed behind the metal plate, a chip on film (COF) having one side electrically connected to the display module and the other side electrically connected to the printed circuit board, a cover member disposed in front of the display module, and an adhesive member disposed between the display module and the metal plate, in which the adhesive member may include a protective part attached to side surfaces of the display module and having one end attached to the cover member.

The protective part may be bent from the side surfaces of the display module and attached to the side surfaces of the display module, and the adhesive member may be made of an opaque material.

The adhesive member and the metal plate may be manufactured as one package, and the package may include a cutting part which has the adhesive member attached to the metal plate and is a cut portion formed on an end portion of the metal plate, and an adhesive film that attaches the cutting part to the adhesive member, the package may be attached to the display module, and then the cutting part and the adhesive film may be removed, and the protective part of the adhesive member may be bent and attached to side surfaces of the display module.

In the display apparatus according to the present disclosure, since the protective part fully seals the side surfaces of the display module, the display panel provided in the display module is not in contact with moisture, and thus it is possible to effectively suppress damage to the display panel due to permeated moisture.

In addition, in the display apparatus according to the present disclosure, since the protective part is made of an opaque material to fully seal the side surfaces of the display module, it is possible to effectively suppress light leakage in which light leaks to the outside from the side surfaces of the display panel of the display module.

Therefore, it is possible to increase the resolution of the display panel and effectively suppress the distortion of the image or video displayed on the display apparatus due to light leakage.

In addition, in the display apparatus according to the present disclosure, it is possible to significantly reduce the defect rate of the display apparatus by performing the process in a method of first manufacturing the package using the automated apparatus and attaching the package to the display module.

Specific effects together with the above-described effects are described together with a description of the following detailed matters for carrying out the disclosure.

Although the present disclosure has been described above with reference to exemplary drawings, the present disclosure is not limited by the embodiments and drawings disclosed in the specification, and it is apparent that various modifications can be made by those skilled in the art within the scope of the technical spirit of the present disclosure. In addition, even when the operational effects according to the configuration of the present disclosure have not been explicitly described in the description of the embodiments of the present disclosure, it goes without saying that the effects predictable by the corresponding configuration should be recognized.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:

a display module configured to display an image;

a metal plate disposed behind the display module;

a cover member disposed in front of the display module; and an adhesive member disposed between the display module and the metal plate, wherein the adhesive member includes a protective part attached to side surfaces of the display module, the protective part having an end attached to the cover member, wherein the display module includes;

a back plate disposed in front of the adhesive member; and a display panel disposed in front of the back plate and configured to display the image.

2. The display apparatus of claim 1, wherein the protective part is bent from the side surfaces of the display module.

3. The display apparatus of claim 1, wherein the adhesive member is made of an opaque material.

4. The display apparatus of claim 2, further comprising an adhesive layer disposed between the cover member and the display module, wherein the protective part is attached to side surfaces of the adhesive layer.

5. The display apparatus of claim 1, wherein the display module includes a polarizer disposed between the display panel and the adhesive layer.

6. The display apparatus of claim 1, wherein the adhesive member and the metal plate are one package coupled to the display module.

7. The display apparatus of claim 6, wherein the package includes a cutting part which has the adhesive member attached to the metal plate and is a cut portion formed on an end portion of the metal plate.

8. The display apparatus of claim 7, wherein the package includes an adhesive film that attaches the cutting part to the adhesive member.

9. The display apparatus of claim 8, wherein the cutting part is disposed at a location of the adhesive member corresponding to the protective part.

10. The display apparatus of claim 9, wherein, after the package is attached to the display module, the cutting part and the adhesive film are configured to be removed, and the protective part of the adhesive member is configured to be bent and attached to the side surfaces of the display module.

11. A method of manufacturing a display apparatus, comprising:

providing a package including an adhesive member and a metal plate coupled to the adhesive member;

coupling the package to a display module;

removing an adhesive film that couples a cutting part of the metal plate to the adhesive member;

bending the protective part of the adhesive member; and attaching the protective part to side surfaces of the display module.

12. The method of claim 11, wherein the cutting part is disposed at a location of the adhesive member corresponding to the protective part, and a width of the cutting part is greater than a width of the protective part.

13. The method of claim 12, wherein the adhesive member includes an exposed area at a portion of the adhesive member that meets an edge of the metal plate in a front-rear direction of the display apparatus.

14. A display apparatus comprising:

a display module configured to display an image;

a metal plate disposed behind the display module;

a printed circuit board disposed behind the metal plate;

a chip on film (COF) having a first side electrically connected to the display module and a second side electrically connected to the printed circuit board;

a cover member disposed in front of the display module; and an adhesive member disposed between the display module and the metal plate, wherein the adhesive member includes a protective part attached to side surfaces of the display module, the protective part having one end attached to the cover member.

15. The display apparatus of claim 14, wherein the protective part is bent from the side surfaces of the display module, and the adhesive member is made of an opaque material.

16. The display apparatus of claim 14, wherein the adhesive member and the metal plate are one package, the package includes:

a cutting part which has the adhesive member attached to the metal plate and is a cut portion formed on an end portion of the metal plate; and an adhesive film that attaches the cutting part to the adhesive member, and after the package is attached to the display module, the cutting part and the adhesive film are configured to be removed, and the protective part of the adhesive member is configured to be bent and attached to the side surfaces of the display module.

* * * * *